United States Patent [19]

Felps

[11] Patent Number: 4,891,607
[45] Date of Patent: Jan. 2, 1990

[54] LOW DISTORTION DRIVE AMPLIFIER

[75] Inventor: Jimmie D. Felps, Colorado Springs, Colo.

[73] Assignee: Hewlett-Packard Company, Palo Alto, Calif.

[21] Appl. No.: 203,230

[22] Filed: Jun. 6, 1988

[51] Int. Cl.$^4$ .............................................. H03F 1/14
[52] U.S. Cl. .................................... 330/296; 330/292; 330/311
[58] Field of Search ............... 330/148, 149, 151, 275, 330/295, 296, 292, 301, 310, 311

[56] References Cited

U.S. PATENT DOCUMENTS 4,153,883 5/1979 Taylor et al. ................... 330/275 X Primary Examiner—Steven Mottola
Attorney, Agent, or Firm—Karl E. Bring

[57] ABSTRACT

The low distortion drive amplifier of the present invention uses an emitter follower circuit to drive a low impedance load such as a transmission line. A constant current source is connected to the emitter terminal of the emitter follower transistor to provide a constant current through the emitter of the emitter follower circuit. Compensation circuitry is provided to offset any load current that is diverted from the emitter follower circuit to the load thereby insuring a constant current through the emitter of the emitter follower transistor. In this fashion, even with a low impedance load, a constant gain and a relatively constant output impedance can be obtained for this amplifier circuit thereby providing a low distortion drive circuit for the low impedance load such as a transmission line.

17 Claims, 1 Drawing Sheet

LOW DISTORTION DRIVE AMPLIFIER

FIELD OF THE INVENTION

This invention relates to drive amplifiers and, in particular, to a low distortion drive amplifier that has automatic load current compensation.

PROBLEM

It is a problem in the field of drive amplifiers to produce an amplifier that has low distortion and whose performance is relatively independent of the load current. A commonly used drive amplifier is the well known emitter follower circuit. The emitter follower circuit is a simple common collector transistor amplifier that has the input connected to its base and the output connected to the emitter of the transistor. The advantage of the emitter follower circuit is that for loads of moderate to high impedance, the gain of this circuit is almost identically equal to one. Thus, the emitter follower circuit is essentially a unity gain amplifier that replicates the input voltage signal with low distortion. In the case where the load attached to the emitter follower is of a small impedance value, such as a reverse terminated 50 ohm transmission line, a gain of 0.5 can be obtained by matching the impedance of the reverse terminating resistor to the impedance of the load. The difficulty with such an arrangement is that the output impedance of the emitter follower circuit and the gain of this circuit are a function of the current through the emitter of the transistor. Therefore, any significant changes in the load resistance or load current will cause distortion in the operation of the emitter follower circuit due to changes in the output impedance and thus the gain of the emitter follower circuit, which is a nonlinear function of the load current.

SOLUTION

The above described problems are solved and a technical advance achieved in the field by the low distortion drive amplifier of the present invention. The low distortion drive amplifier uses an emitter follower to drive a low impedance load such as a transmission line. A constant current source is connected to the emitter terminal of the emitter follower transistor to provide a constant current through the emitter of the emitter follower circuit. Compensation circuitry is provided to offset any load current that is diverted from the constant current source to the load thereby insuring a constant current through the emitter of the emitter follower transistor. This compensation circuit is connected in parallel with the emitter follower circuit. In one embodiment, this compensation circuit is a common emitter amplifier of the opposite conductivity type of the basic emitter follower drive amplifier. Thus, the compensation circuit is a mirror image of the emitter follower drive amplifier and responds the same as the emitter follower drive amplifier when activated with the complement of the input signal. Any change in the emitter current in the emitter follower drive amplifier caused by a particular input signal is exactly replicated in the compensation circuit by application of the complement of the input signal to the compensation circuit. This compensation circuit output current is applied to the constant current source to replace the current that was diverted from the emitter terminal of the emitter follower transistor to the load. This maintains a constant current in the emitter terminal of the emitter follower drive amplifier. In this fashion, even with a low impedance load, a relatively constant gain and output impedance can be obtained for this amplifier circuit thereby providing a low distortion drive circuit for the low impedance load such as a transmission line. A further improvement is that this amplifier circuit exhibits an increased input impedance.

DETAILED DESCRIPTION OF THE DRAWING

Figure 1:
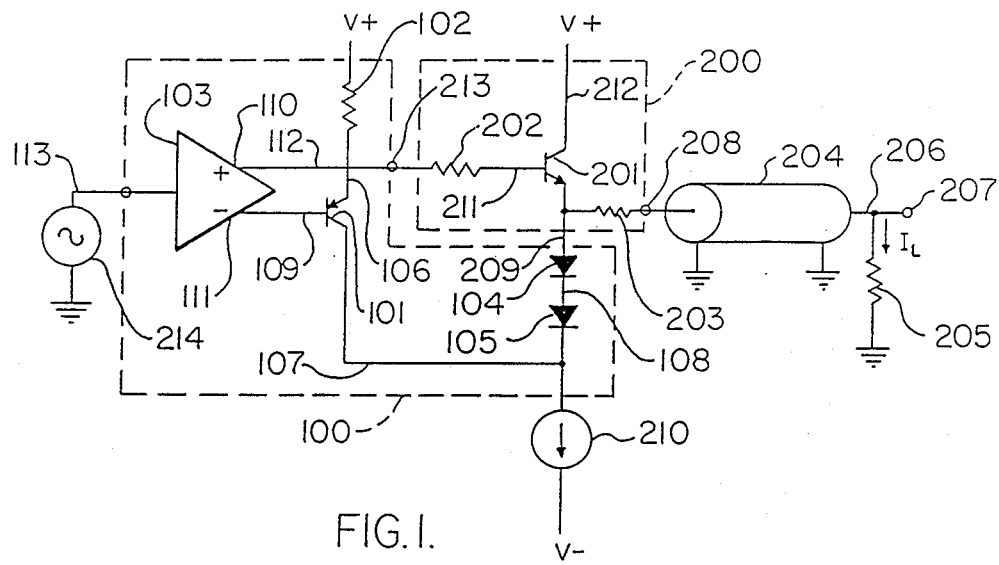
FIG. 1 illustrates the preferred embodiment of the low distortion drive amplifier.

It is a problem in the field of drive amplifiers to produce an amplifier that has low distortion and whose performance is relatively independent of the load current. A commonly used drive amplifier is the well known emitter follower circuit. The emitter follower is a simple common collector transistor amplifier that has the input connected to its base and the output connected to the emitter of the transistor. The advantage of the emitter follower circuit is that for loads of moderate to high impedance, the gain of this circuit is almost identically equal to one. Thus, the emitter follower circuit is essentially a unity gain amplifier that replicates the input voltage signal with low distortion. In the case where the load attached to the emitter follower is of a small impedance value, such as a reverse terminated 50 ohm transmission line, matching the impedance of the reverse terminating resistor with the impedance of the load yields a gain of 0.5. The difficulty with such an arrangement is that the output impedance of the emitter follower circuit and the gain of this circuit are both a function of the current through the emitter of the transistor. Therefore, any significant change in the load impedance or load current will cause distortion in the operation of the emitter follower circuit due to a change in the output impedance and thus the gain of the emitter follower circuit, which is a nonlinear function of the load current.

The low distortion drive amplifier of the present invention uses a constant current source connected to the emitter terminal of the emitter follower transistor to provide a constant current through the emitter of the emitter follower circuit. Compensation circuitry is also provided to offset any load current that is diverted from the constant current source to the load thereby insuring a constant current through the emitter of the emitter follower transistor. This compensation circuit is connected in parallel with the emitter follower circuit. In one embodiment, this compensation circuit is a common emitter amplifier of the opposite conductivity type of the basic emitter follower drive amplifier. Thus, the compensation circuit is a mirror image of the emitter follower drive amplifier and responds the same as the emitter follower drive amplifier when activated with the complement of the input signal. Any change in the emitter current in the emitter follower drive amplifier caused by a particular input signal is exactly replicated in the compensation circuit by application of the complement of the input signal to the compensation circuit. This compensation circuit output current is applied to the constant current source to replace the current that was diverted from the emitter terminal of the emitter follower transistor to the load. This maintains a constant current in the emitter terminal of the emitter follower drive amplifier. In this fashion, even with a low impedance load, a relatively constant gain and output impedance can be obtained for this amplifier circuit thereby providing a low distortion drive circuit for the low impedance load such as a transmission line.

Basic Emitter Follower Circuit

Figure 2:
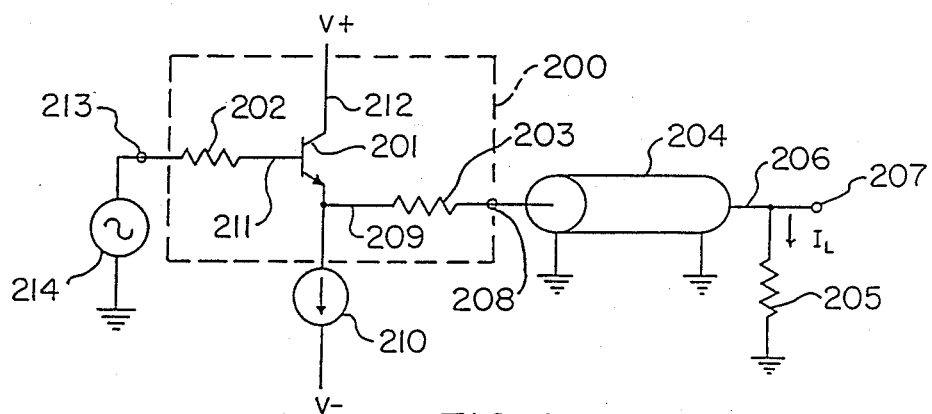
FIG. 2 illustrates a basic emitter follower circuit.

FIG. 2 illustrates a typical emitter follower circuit 200 that is shown driving a low impedance load such as a reverse terminated 50 ohm transmission line 204. The basic emitter follower circuit 200 is shown outlined by dashed lines. The basic emitter follower circuit 200 consists of an NPN transistor 201 whose collector terminal is connected via lead 212 to a source of voltage. The base terminal of transistor 201 is connected via lead 211 to one terminal of an input resistor 202. The other terminal of input resistor 202 is connected to the input terminal 213 of the emitter follower circuit 200. The emitter terminal of transistor 201 is connected via lead 209 to one terminal of reverse terminating resistor 203, the other terminal of which is in turn connected to output terminal 208. In addition, the emitter terminal of transistor 201 is connected via lead 209 to a current source 210 which draws a current of fixed predetermined value. The basic emitter follower circuit 200 drives a load, which in this case consists of a transmission line 204 which typically has an impedance of 50 ohms. The transmission line 204 is connected via lead 206 to a load impedance, resistor 205 and to an output terminal 207 where the output voltage is obtained. Emitter follower circuit 200 is driven by a voltage source 214 which applies an input voltage to input terminal 213 of emitter follower circuit 200.

In operation, the impedance of the load resistor 205 is typically matched to the impedance of the transmission line 204. Therefore, the impedance of resistor 205 and transmission line 204 is typically 50 ohms. The gain of the basic emitter follower circuit 200 illustrated in FIG. 2 is given by the following equation:

$$A = \frac{R_L}{R_L + R_O + R_T} \tag{1}$$

where $R_O$ = output impedance of transistor 201
$R_L$ = impedance of the load resistor 205
$R_T$ = reverse terminating resistance 203 of transmission line 204

As can be seen from this equation, the gain of the emitter follower circuit 200 is a function of the impedance of the reverse terminating resistor 203, the impedance of load resistor 205 and the output impedance of transistor 201. The output impedance of transistor 201 ($R_O$) is a function of the current through the emitter terminal of transistor 201. Typically, the output impedance of transistor 201 is on the order of a few ohms and presents a negligible contribution to the gain equation except in the case where the other terms in that equation are small. In this case, $R_L$ is 50 ohms and $R_T$ is approximately 47 ohms, therefore any variation in the output resistance $R_O$ of transistor 201 does significantly contribute to the variation in the gain of the emitter follower circuit 200.

In order to better understand the output impedance of transistor 201, the following equation defines the dominant components that constitute the output impedance $R_O$ of transistor 201.

$$R_O = \frac{R_b}{b} + R_e + \frac{0.026}{I_E} \tag{2}$$

where $R_b$ = base source impedance of transistor 201
$b$ = forward beta of transistor 201
$R_e$ = emitter resistance of transistor 201
$I_E$ = emitter current of transistor 201

The first two terms in this equation are fairly constant and on the order of 2 ohms. Therefore the significant term in equation 2 is the third term which is a function of the emitter current of transistor 201. In the case where no current is applied to load resistor 205, the current through the emitter terminal of transistor 201 is equal to the current drawn by current source 210 which could be on the order of 20 milliamperes. In this case, using equation 2 above, $R_O$ becomes equal to 3.3 ohms. Therefore, the impedance of resistor 203 is selected to be equal to 46.7 ohms so that the sum of the output impedance of transistor 201 and the reverse terminating resistance of transmission line 204 is equal to the impedance of the load resistor 205 which is 50 ohms. This relationship is expressed as:

$$R_L = R_T + R_O \tag{3}$$

In the steady state case where the output voltage at terminal 207 is 0 volts and no current is being provided to the load resistor 205 by emitter follower circuit 200, then the output impedance $R_O$ of transistor 201 is approximately 3.3 ohms and the gain of this circuit, as given by equation 1, is approximately 0.5. However, it is obvious that as the emitter current of transistor 201 varies due to the load current $I_L$ being drawn by load resistor 205, the output impedance $R_O$ of transistor 201 will vary thereby varying the gain of the emitter follower circuit 200. This gain variation causes amplitude distortion which is an undesirable characteristic for a drive amplifier circuit. Since the load impedance is so small, any variation in the output impedance $R_O$ of transistor 201 has a significant effect on the gain of emitter follower circuit 200 and causes a significant amount of amplitude distortion. To avoid amplitude distortion in this circuit, the emitter current of transistor 201 must remain constant.

Compensation Circuit

FIG. 1 illustrates the circuit of FIG. 2 with the addition of compensation circuit 100. Compensation circuit 100 functions to maintain the emitter current in transistor 201 constant to prevent variation in the output impedance $R_O$ of transistor 201 thereby maintaining a constant gain for emitter follower circuit 200 to prevent amplitude distortion. Compensation circuit 100 is responsive to the input signal generated by source 214 to generate a correction current which is applied to constant current source 210. The correction current applied to constant current source 210 matches the current supplied by emitter follower circuit 200 to load resistor 205. Therefore, as the current output by emitter follower circuit 200 is diverted from transistor 201 and applied instead to load resistor 205, compensation circuit 100 inserts a duplicate of that diverted current into emitter follower circuit 200 to thereby maintain a constant current in the emitter terminal of emitter follower transistor 201.

Compensation circuit 100 includes a common emitter amplifier of opposite conductivity type from emitter follower circuit 200. This amplifier consists of transistor 101 whose emitter terminal is connected by lead 106 to resistor 102 which in turn is connected to a source of voltage. The collector terminal of transistor 101 is connected to the constant current source 210 via the output terminal of compensation circuit 100. Amplifier 103 is a unity gain amplifier that has differential outputs consisting of a noninverting output 110 and an inverting output 111. Thus, the input signal produced by voltage source 214 is applied over conductor 113 to unity gain amplifier 103. The input signal is replicated by unity gain amplifier 103 and output on lead 112 to the input terminal 213 of emitter follower circuit 200. Unity gain amplifier 103 also produces the complement of the input signal and outputs this signal on lead 109 to the base terminal of transistor 101. Thus, transistors 201 and 101 receive the input signal and its complement, respectively. Resistor 102 determines the collector current of transistor 101, which collector current is applied to constant current source 210. In order to match the current that is diverted from the emitter terminal of transistor 201 to the load resistance 205, the value of resistor 102 is selected to be equal to the sum of the impedances of the load resistor ($R_L$) 205 and the reverse terminating resistance ($R_T$) of transmission line 204 minus the emitter output impedance ($R_O$) of transistor 101. Again, $R_O$ is expressed in equation 2 and is approximately 3.3 ohms.

This relationship is given in equation 4:

$$R_1 = R_T + R_L - R_O \tag{4}$$

A pair of diodes 104, 105 are also included in compensation circuit 100. Diodes 104 and 105 are connected to each other in series, cathode to anode such that the anode terminal of diode 104 is connected via lead 209 to the emitter terminal of transistor 201. The cathode terminal of diode 105 in turn is connected by lead 107 to the output terminal of constant current source 210. The function of diodes 104 and 105 is to increase the collector to emitter voltage of transistor 101 thereby preventing collector saturation of transistor 101 for the signal swings desired.

One change in emitter follower circuit 200 is that the value of the reverse terminating resistance 203 of transmission line 204 is modified due to the fact that a reduced current is flowing through the emitter terminal of transistor 201. The constant current source 210 still draws 20 milli-amps as in the previous example but this current is now supplied equally by transistor 101 and transistor 201. Therefore, equation 2, when the value 10 milli-amps is substituted for the term $I_E$, can be solved to produce a value of 4.6 ohms as the output impedance $R_O$ of transistor 201. In order to obtain a gain of 0.5, using equation 1, it is obvious that the value of the reverse terminating resistance $R_T$ of transmission line 204 should be 45.4 ohms since the impedance of load resistor 205 given by $R_L$ equals 50 ohms.

Compensation Example

In operation, the low distortion drive amplifier of FIG. 1 functions to operate with constant gain and low amplitude distortion. As the output voltage on terminal 207 becomes positive, transistor 201 of emitter follower circuit 200 is required to supply a load current $I_L$ through reverse terminating resistance 203, transmission line 204 into load resistor 205. In order to prevent the emitter current in transistor 201 from increasing by this amount, the collector current of transistor 101 in compensation circuit 100 increases by an amount equal to the load current $I_L$. Since constant current source 210 is sinking a constant current, the amount of current flowing through diodes 104, 105 is decreased by an amount equal to the load current $I_L$. Therefore, the current through the emitter terminal of transistor 201 remains unchanged. An equal but opposite effect occurs when the output voltage at terminal 207 goes negative. There, the collector current in transistor 101 is made to change proportional to the load current $I_L$ in the following manner. First the quiescent currents through transistors 101 and 201 are equal to 10 milli-amps to provide a symmetrical voltage swing about ground. Resistor R1 is selected according to the following relationship:

$$R_1 = R_T + R_L - R_O \tag{5}$$

Thus, the impedance value of resistor R1 is equal to the impedance of the reverse terminating resistance $R_T$ plus the impedance of the load resistance $R_L$ less the output impedance of transistor 101 $R_O$, which output resistance is obtained by using equation 2 above for transistor 201. In solving this equation, the impedance value of resistor R1 is selected to be 90.8 ohms for an emitter current of 10 milli-amps. Unity gain amplifier 103 has differential outputs which produce equal amplitude but opposite phase signals which are a replica of the input signal applied by voltage source 214. Unity gain amplifier 103 causes the voltage change across resistor 102 to be approximately equal to the voltage change across the reverse terminating resistance 203 of transmission line 204 and load resistor 205. With ideal compensation, the emitter current in transistor 201 remains constant and the output impedance of this transistor $R_O$ simply causes an offset voltage and is no longer part of the gain equation since it is a constant. Thus, in the low distortion drive amplifier circuit, the gain remains constant at 0.5 and is not a function of any variable terms since the emitter current through transistor 201 remains constant. This circuit significantly reduces the amplitude distortion and has the advantage of using no feedback circuitry thereby improving its stability and consequently high frequency bandwidth is achievable using this circuit.

While a specific embodiment of this invention has been disclosed, it is expected that those skilled in the art can and will devise variations of the disclosed embodiment, which variations fall in the scope of the appended claims.

I claim:

1. A low distortion amplifier circuit for driving a load comprising:
    emitter follower circuit of a first conductivity type and having input and output and bias terminals;
    common emitter amplifier circuit of a conductivity type opposite of said emitter follower circuit and having input and output terminals;
    input amplifier having differential outputs, and responsive to an input signal for applying said input signal to said input terminal of said emitter follower circuit and the complement of said input signal to said input terminal of said common emitter amplifier circuit;

constant current means connected to said bias terminal of said emitter follower circuit and said output terminal of said common emitter amplifier circuit for drawing a fixed current from said bias terminal of said emitter follower circuit and said output terminal of said common emitter amplifier circuit;

means for connecting said load to said output terminal of said emitter follower circuit.

2. The amplifier of claim 1 wherein said emitter follower circuit comprises:

NPN transistor, having base, collector and emitter terminals, with said collector terminal connected to a voltage source;

input resistor means interposed between said base terminal and said input terminal;

reverse terminating resistor means interposed between said emitter terminal and said output terminal.

3. The amplifier of claim 1 wherein said common emitter amplifier circuit comprises:

PNP transistor, having base, collector and emitter terminals, with said collector terminal connected to said output terminal and said base terminal connected to said input terminal;

source resistor means interposed between said emitter terminal and a voltage source.

4. The amplifier of claim 1 wherein said input amplifier comprises a unity gain amplifier.

5. The amplifier of claim 1 further including:

first and second diode means interposed between said bias terminal and said constant current means with the anode of the first diode means connected to said bias terminal, the cathode of said first diode means connected to the anode of said second diode means and the cathode of said second diode means connected to said constant current means.

6. A low distortion amplifier having input and output terminals for driving a load connected to said output terminal comprising:

emitter follower circuit having input, output, and bias terminals;

constant current means connected to said bias terminal of said emitter follower circuit for drawing a constant current therefrom;

compensation means interposed between said input terminal of said amplifier and said input terminal of said emitter follower circuit and between said constant current means and said bias terminal of said emitter follower circuit for injecting a current into said constant current means equal to a current supplied to said load by said emitter follower circuit.

7. The amplifier of claim 6 wherein said emitter follower circuit comprises:

NPN transistor, having base, emitter and collector terminals, where said collector terminal is connected to a voltage source;

input resistor means connected between said input terminal of said emitter follower circuit and said base terminal of said NPN transistor;

reverse terminating means connected between said output terminal of said emitter follower circuit and said emitter terminal of said NPN transistor.

8. The amplifier of claim 6 wherein said compensation means includes:

PNP transistor, having base, collector and emitter terminals, with said collector terminal is connected to said constant current means and said bias terminal of said emitter follower and said base terminal is connected to said input terminal;

source resistor means interposed between said emitter terminal of said PNP transistor and a voltage source.

9. The amplifier of claim 8 wherein said compensation means includes:

input amplifier means having differential outputs, and responsive to an input signal for applying said input signal to said input terminal of said emitter follower circuit and the complement of said input signal to said base terminal of said PNP transistor.

10. The amplifier of claim 9 wherein said input amplifier means comprises a unity gain amplifier.

11. The amplifier of claim 8 wherein said compensation means further includes:

first and second diode means interposed between said bias terminal and said constant current means with the anode of said first diode means connected to said bias terminal, the cathode of said first diode means connected to the anode of said second diode means, the cathode of said second diode means connected to said constant current means.

12. A low distortion amplifier having input and output terminals for driving a load connected to said output terminal with an input signal applied to said input terminal comprising:

emitter follower amplifier having input, output and bias terminals, with said emitter follower amplifier output terminal connected to said load;

constant current circuit means connected to said bias terminal of said emitter follower amplifier for drawing a fixed current;

compensation amplifier means having input and output terminals, with said compensation amplifier output terminal connected to said constant current circuit means and said bias terminal of said emitter follower amplifier;

input amplifier means connected to said emitter follower amplifier input terminal and said compensation amplifier means input terminal and responsive to said input signal for applying said input signal to said emitter follower amplifier input terminal and the complement of said input signal to said compensation amplifier means input terminal;

wherein said emitter follower amplifier and said compensation amplifier means are responsive to said input signal and said complement of said input signal respectively to apply a drive signal to said load and said constant current circuit means respectively, thereby maintaining a constant current from said emitter of said emitter follower amplifier.

13. The amplifier of claim 12 wherein said emitter follower amplifier comprises:

NPN transistor, having base, collector and emitter terminals, with said collector terminal connected to a voltage source;

input resistor means interposed between said base terminal and said input terminal;

reverse terminating resistor means interposed between said emitter terminal and said output terminal.

14. The amplifier of claim 12 wherein said compensation amplifier means comprises:

PNP transistor, having base, collector and emitter terminals, with said collector terminal connected to said bias terminal and said constant current source means and said base terminal connected to said input terminal;

source resistor means interposed between said emitter terminal and a voltage source.

15. The amplifier of claim 12 wherein said input amplifier means comprises a unity gain amplifier.

16. The amplifier of claim 14 wherein said compensation amplifier means further includes:

first and second diode means interposed between said bias terminal and said constant current means with the anode of said first diode means connected to said bias terminal, the cathode of said first diode means connected to the anode of said second diode means, the cathode of said second diode means connected to said constant current means.

17. A low distortion amplifier circuit for driving a load comprising:

emitter follower circuit of a first conductivity type and having input and output terminals, including:

NPN transistor, having base, collector and emitter terminals, with said collector terminal connected to a voltage source, input resistor means interposed between said base terminal and said input terminal, reverse terminating resistor means interposed between said emitter terminal and said output terminal;

common emitter amplifier circuit of a conductivity type opposite of said emitter follower circuit and having input and output terminals, including:

PNP transistor, having base, collector and emitter terminals, with said collector terminal connected to said bias terminal of said emitter follower circuit and said base terminal connected to said input terminal;

source resistor means interposed between said emitter terminal and a voltage source;

input amplifier means having differential outputs, and responsive to an input signal for applying said input signal to said input terminal of said emitter follower circuit and the complement of said input signal to said input terminal of said common emitter amplifier circuit;

constant current means connected to said bias terminal of said emitter follower circuit and said collector terminal of said common emitter amplifier circuit for drawing a fixed current from said bias terminal and said collector terminal of said emitter follower circuit and said common emitter amplifier respectively;

means for connecting said load to said output terminal of said emitter follower circuit;

wherein said emitter follower circuit and said common emitter amplifier circuit are responsive to said input signal and said complement of said input signal respectively to apply a drive signal to said load and said constant current circuit respectively, thereby maintaining a constant current from said emitter follower circuit emitter terminal.

* * * * *